United States Patent [19]

Geis et al.

[11] Patent Number: 4,565,599
[45] Date of Patent: Jan. 21, 1986

[54] GRAPHOEPITAXY BY ENCAPSULATION

[75] Inventors: Michael W. Geis, Acton; Henry I. Smith, Sudbury; Dimitri A. Antoniadis, Brookline; Dale C. Flanders, Lexington, all of Mass.

[73] Assignee: Massachusetts Institute of Technology, Cambridge, Mass.

[21] Appl. No.: 680,237

[22] Filed: Dec. 10, 1984

Related U.S. Application Data

[63] Continuation of Ser. No. 332,553, Dec. 21, 1981, abandoned, which is a continuation of Ser. No. 181,102, Aug. 25, 1980, abandoned.

[51] Int. Cl.$^4$ .............................................. C30B 1/08
[52] U.S. Cl. .......................... 156/603; 148/DIG. 152
[58] Field of Search .................. 156/617 R, DIG. 88, 156/DIG. 80, DIG. 64, 612, 613, 603; 427/93, 95; 148/1.5, DIG. 152

[56] References Cited

U.S. PATENT DOCUMENTS

| | | | |
|---|---|---|---|
| 3,585,088 | 6/1971 | Schwuttke et al. | 156/603 |
| 4,059,461 | 11/1977 | Fan et al. | 148/1.5 |
| 4,174,422 | 11/1979 | Matthews | 156/613 |
| 4,333,792 | 6/1982 | Smith | 156/612 |

OTHER PUBLICATIONS

Gibbons, Appl. Phys. Lett. 6/15/79, pp. 831–832.
Billings, J. Vac Science and Technology V.6, p. 757 (1969).

Primary Examiner—Hiram H. Bernstein
Attorney, Agent, or Firm—Charles Hieken

[57] ABSTRACT

Improvements on the graphoepitaxial process for obtaining epitaxial or preferred orientation films are described wherein a cap of material is formed over the film to be oriented, artificial surface-relief structure may be present in the substrate, the cap, or both, and the film may be heated by irradiation with electromagnetic radiation.

7 Claims, 13 Drawing Figures

GRAPHOEPITAXY BY ENCAPSULATION

The Government has rights in this invention pursuant to Contract Number AF19(628)-80-C-0002 awarded by the U.S. Department of the Air Force and Contract Number DE-AC02-80ER10179 awarded by the U.S. Department of Energy.

This application is a continuation of application Ser. No. 332,553 filed Dec. 21, 1981 now abandoned which is a continuation of Ser. No. 181,102 filed Aug. 25, 1980 now abandoned.

BACKGROUND OF THE INVENTION

This invention is an improvement on an earlier invention disclosed in copending application Ser. No. 756,358 of Henry I. Smith for Enhancing Epitaxy and Preferred Orientation, now U.S. Pat. No. 4,333,792, granted June 8, 1982, and relates, in general, to improving the crystallographic quality of solid films grown on surfaces of solid substrates, and more particularly, to improved means for obtaining epitaxial or preferred orientation films on solid substrates, both crystalline and amorphous.

Much of modern technology makes use of thin solid films on the surfaces of solid substrates. Epitaxial and preferred orientation films are particularly important, notably in microelectronic devices, thin film optical devices and solar cells. Thus, improved methods of preparing epitaxial and preferred orientation films are of great importance.

The principle involved in the earlier invention, referenced above, was to use a plurality of artificial defects, formed at predetermined locations at the surface of a solid substrate, to determine, control or influence, by means of the geometric arrangement of adjacent defects, the crystallographic orientation of a film deposited at said surface. The said artificial defects were either (1) artificial point defects or (2) artificial surface relief structure. The method disclosed in said earlier patent has been named "graphoepitaxy" (see "Crystallographic Orientation of Silicon on an Amorphous Substrate Using an Artificial Surface Relief Grating and Laser Crystallization", by M. W. Geis, D. C. Flanders and H. I. Smith, in Applied Physics Letters, Vol. 35, pp. 71–74, July 1, 1979). The name is derived from the Greek ("grapho" meaning to write or incise) and was chosen to convey the principle of using an artificially created surface pattern to induce epitaxy. In addition to the aforesaid copending application Ser. No. 756,358) two additional copending applications disclose improvements on the graphoepitaxy process. These copending applications are entitled "Improving Graphoepitaxy", by M. W. Geis, D. C. Flanders and H. I. Smith, Ser. No. 43,541 filed May 29, 1979, now abandoned, and "Three Dimensional Integration by Graphoepitaxy", by H. I. Smith, D. C. Flanders and M. W. Geis, Ser. No. 43,389 filed May 29, 1979, now abandoned. The present invention concerns (1) the use of a cover or "cap" of material over a film to be oriented; (2) the use of such a cap over a film to be oriented wherein the film is formed into discrete islands or stripes; (3) the use of such a cap over a film to be oriented wherein the substrate on which the film is located has artificial surface relief structure formed in it; (4) the use of such a cap over a film to be oriented wherein the cap has artificial surface relief structure formed in it; (5) the use of such a cap over a film to be oriented wherein both the substrate and the cap have artificial surface relief structure formed in them; (6) the use of a cap over a film to be oriented in any of the above configurations together with heating of the film by irradiation with electromagnetic radiation.

SUMMARY OF THE INVENTION

A film, consisting of a continuous sheet of material on a substrate or formed into one or more discrete islands or stripes on a substrate, is covered with a "cap" that consists of a second film or covering of material. Thereafter, the first film is induced to take on a preferred or epitaxial crystallographic orientation by heating it to a high temperature.

DETAILED DESCRIPTION

The copending application entitled, "Improving Graphoepitaxy", described a process that had been used to orient silicon films. That process included the formation of a relief grating in a SiO$_2$ substrate, the deposition of amorphous or fine grain polycrystalline silicon over the substrate and the crystallization of the silicon under a laser beam. If the crystallization was done in air at an appropriate power level, the silicon became oriented relative to the relief grating. Subsequent experimental work and x-ray analysis (see M. W. Geis, D. A. Antoniadis, D. J. Silversmith, R. W. Mountain and H. I. Smith, "Silicon graphoepitaxy using a strip-heater oven", published in Applied Physics Letters, September 1980), showed that the silicon films over the gratings consisted of many crystallites having their <100> directions parallel to the grating axis to within about 8 to 15 degrees and perpendicular to the substrate plane to within about 3 degrees. Research also showed that an oxide film formed over the silicon when it was heated with the laser in air to near the crystallization temperature, and that this oxide film was necessary to achieve a (100) texture or a strong alignment effect. For example, laser crystallization in inert gases such as argon yielded neither (100) texture nor orientation.

Figure 1:
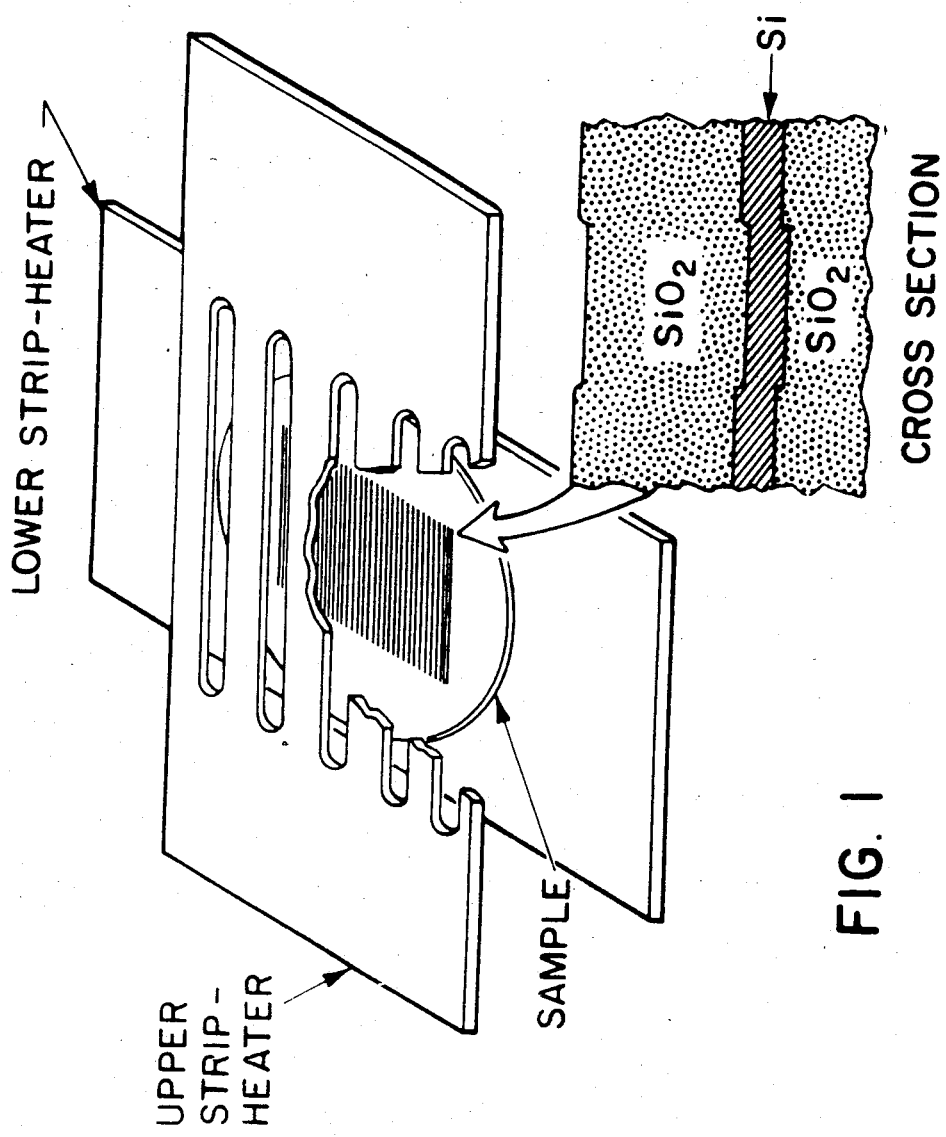
FIG. 1: Illustrates a strip-heater oven in which a sample is located on top of the lower strip. Current passed through the two strips heats the sample to a high temperature such that crystallization occurs in a silicon film. The sample configuration is depicted in the inset which shows an $SiO_2$ substrate in which a relief structure is formed, a silicon film, and a cap of $SiO_2$ covering said film.
Figure 2I:
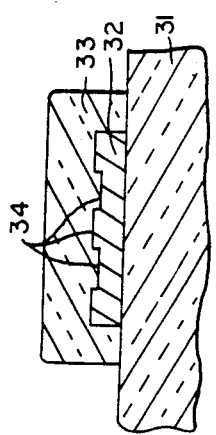
FIG. 2(i): Depicts a configuration in which a film on a substrate is formed into discrete islands, a relief structure is formed in said islands and the islands are covered with a cap.
Figure 2J:
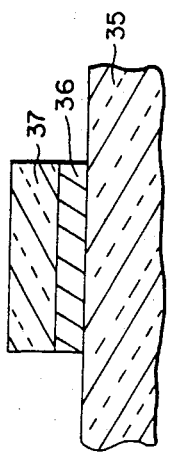
FIG. 2(j): Depicts a configuration in which a film is formed into discrete islands and a cap is formed on only the top side of said islands.
Figure 2K:
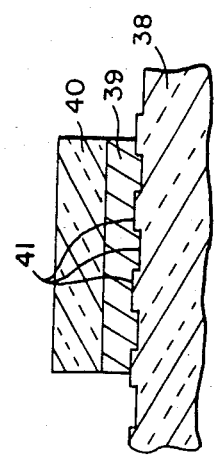
FIG. 2(k): Depicts a configuration in which a relief structure is formed on a substrate, a discrete island is formed thereon and a cap covers only the top side of said island.
Figure 2L:
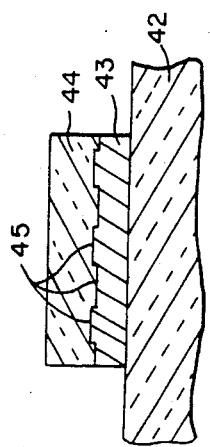
FIG. 2(l): Depicts a configuration in which an island is formed on a substrate and a relief structure is formed on said island and the top of said island is covered with a cap.

The most recent improvement of the silicon graphoepitaxy process includes depositing amorphous or polycrystalline silicon over a relief grating in an SiO$_2$ substrate, intentionally depositing an SiO$_2$ overlayer or "cap" on top of the silicon prior to crystallization, and using a strip-heater oven, rather than a laser, to heat the sample and produce crystallization. FIG. 1 depicts a strip-heater oven as well as the cross-section of such a sample configuration corresponding to FIG. 2(b). As reported in the journal article in the September 1980 issue of Applied Physics Letters, crystallization with the strip-heater oven of silicon films in the same configuration depicted in FIG. 2(a) (i.e., a continuous film, 2, on a substrate, 1, with no surface relief structure and with a cap, 3, over the film) wherein the substrate and cap were SiO$_2$, yielded a strong (100) texture (i.e., <100> directions of grains are substantially perpendicular to the substrate surface). The sample configuration depicted in FIG. 2(b) (i.e., a continuous film, 5, over a surface relief structure, 7, in a substrate, 4, with a cap, 6, over the film), wherein the film was Si and the substrate and cap were SiO$_2$, yielded a highly oriented film after strip-oven heating to the crystallization temperature. With the sample configuration depicted in FIG. 2(c), (i.e., discrete islands of a film, 9, over a substrate, 8, and a cap, 10, with no surface relief structure in either cap or substrate) for the case of Si islands in the form of stripes rectangular islands with the length many times greater than the width on SiO$_2$ substrates with SiO$_2$ caps, a (111) texture was obtained after strip-oven heating to the crystallization temperature. (This result was not reported in the above journal article.)

FIG. 2 depicts a variety of sample configurations encompassed within the inventive concepts of this application. All of said configurations include a substrate, a film to be oriented and a cap. A relief structure may be present in the substrate or the cap or both.

Figure 2E:
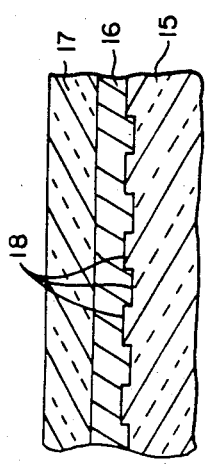
FIG. 2(e): Depicts a configuration in which a relief structure is formed on a substrate, a film is formed thereon and a cap having no relief structure in it is formed on top of said film.
Figure 2F:
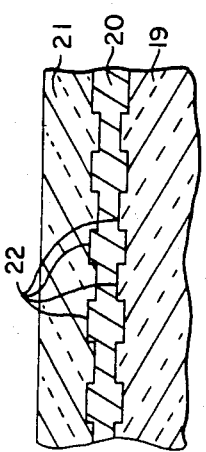
FIG. 2(f): Depicts a configuration in which relief structures are formed both in the substrate and in the cap covering a film.
Figure 2G:
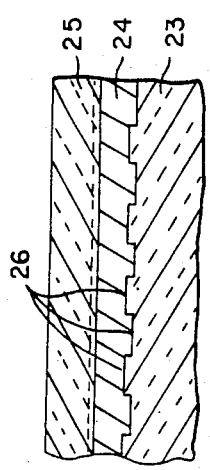
FIG. 2(g): Depicts a configuration in which a grating is formed in a substrate and in a cap over a film, and the two gratings are not parallel.
Figure 2H:
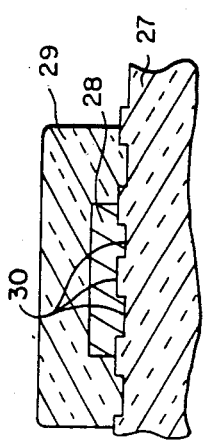
FIG. 2(h): Depicts a configuration in which a relief structure is formed on a substrate and a film is formed into islands on top of said relief structure and said islands are covered with a cap.
Figure 2A:
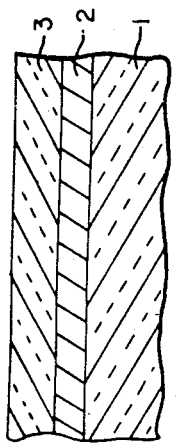
FIG. 2(a): Illustrates a sample configuration consisting of a substrate, a film and a cap.
Figure 2B:
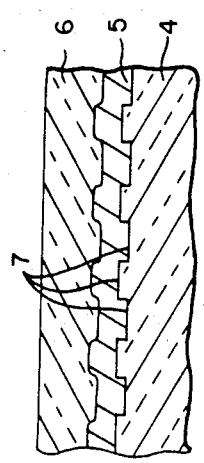
FIG. 2(b): Illustrates a sample configuration in which a relief structure is formed in a substrate, a film is formed on top of it and a cap is formed on top of said film.
Figure 2C:
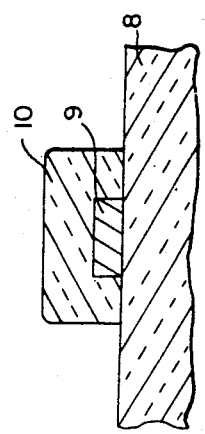
FIG. 2(c): Depicts a configuration in which a film is formed into discrete islands on a substrate and then covered with a cap.

FIG. 2(c) depicts a sample configuration in which a film, 9, is formed into discrete islands over a substrate, 8, and thereafter said film islands are covered with a cap, 10, which covers the top and some of the sidewall area of the island. Said islands can be in a variety of shapes including squares, rectangles, and parallelograms.

Figure 2D:
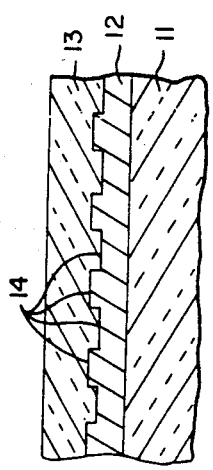
FIG. 2(d): Depicts a configuration in which a relief structure is formed on top of a film and a cap is located on top of said film.

FIG. 2(d) depicts a configuration in which the film, 12, is located on top of the substrate, 11, and the relief structure, 14, is formed in the film, 12, the cap, 13, is formed over said relief structure.

FIG. 2(e) depicts a configuration in which a relief structure, 18, is formed only in substrate, 15, the film to be oriented is located on top of said substrate and the cap, 17, is formed on top of said film.

FIG. 2(f) depicts a configuration in which a relief structure, 22, is formed in both the substrate, 19, and the cap, 21, the film, 20, being located between said cap and said substrate.

FIG. 2(g) depicts a configuration in which relief structures are present in both the substrate, 23, and the cap, 25, and said relief structures are gratings, and the axes of said gratings are oriented in different directions.

In FIG. 2(g) the grating in the cap is oriented orthogonally to the grating in the substrate, but other angles may also be employed.

FIG. 2(h) depicts a configuration in which the film, 28, is formed into discrete islands over a substrate, 27, in which a relief structure, 30, is formed and the discrete islands are covered with a cap, 29.

FIG. 2(i) depicts a configuration in which discrete islands, 32, are formed on substrate, 31, and a relief structure, 34, is formed on the top side of said islands, and said islands are covered with a cap, 33, which encloses the top side and at least some of the sidewall area of the islands. FIG. 2(j) depicts a configuration in which a cap, 37, is formed on only the top side of a discrete island, 36, located on top of substrate, 35.

FIG. 2(k) depicts a configuration in which discrete islands, 39, are located on top of substrate, 38, in which a relief structure, 41, is formed and said island is covered only on the top side with a cap, 40.

FIG. 2(l) depicts a configuration in which discrete islands, 43, are located on top of substrate, 42, and a relief structure, 45, is formed in the top side of said island which is covered with cap, 44, on the top side only.

There has been described novel structure and techniques for enhancing epitaxy and preferred orientation. It is evident that those skilled in the art may now make numerous uses and modifications of and departures from the specific embodiments described herein without departing from the inventive concepts. Consequently, the invention is to be construed as embracing each and every novel feature and novel combination of features present in or possessed by the apparatus and techniques herein disclosed and limited solely by the spirit and scope of the appended claims.

What is claimed is:

1. A method of enhancing epitaxy or preferred orientation in a silicon film on a silicon dioxide substrate which method includes the steps of depositing a silicon film to be oriented on the surface of a solid silicon dioxide substrate, depositing a cap of material over said film to be oriented prior to crystallizing said film so that said cap coacts with said substrate and helps enhance epitaxy or preferred orientation in said film when said film is crystallized, and applying heat to said film while sandwiched between said cap and said substrate to crystallize said film.

2. A method of enhancing epitaxy or preferred orientation in a film on a substrate which method includes the steps of depositing a film to be oriented on the surface of a solid substrate, depositing a cap of material over said film to be oriented prior to crystallizing said film so that said cap coacts with said substrate and helps enhance epitaxy or preferred orientation in said film when said film is crystallized, applying heat to said film while sandwiched between said cap and said substrate to crystallize said film, and forming said film into discrete spaced portions.

3. A method of enhancing epitaxy or preferred orientation in a film on a substrate which method includes the steps of depositing a film to be oriented on the surface of a solid substrate, depositing a cap of material over said film to be oriented prior to crystallizing said film so that said cap coacts with said substrate and helps enhance epitaxy or preferred orientation in said film when said film is crystallized, applying heat to said film while sandwiched between said cap and said substrate to crystallize said film, and forming an artificial surface relief structure in at least one of said cap and said substrate.

4. A method of enhancing epitaxy or preferred orientation in a film on a substrate which method includes the steps of depositing a film to be oriented on the surface of a solid substrate, depositing a cap of material over said film to be oriented prior to crystallizing said film so that said cap coacts with said substrate and helps enhance epitaxy or preferred orientation in said film when said film is crystallized, applying heat to said film while sandwiched between said cap and said substrate to crystallize said film, and heating said film by irradiation with electromagnetic radiation.

5. A method of enhancing epitaxy or preferred orientation in accordance with claim 1 wherein said step of applying heat to said film while sandwiched between said cap and said substrate to crystallize said film includes heating the sandwich comprising said substrate, said film and said cap between a lower strip heater and an upper strip heater.

6. A method of enhancing epitaxy or preferred orientation in accordance with claim 1 wherein said cap is silicon dioxide.

7. A method of enhancing epitaxy or preferred orientation in accordance with claim 5 wherein said cap is silicon dioxide.

* * * * *